United States Patent
Knapp et al.

[11] Patent Number: 5,973,337
[45] Date of Patent: Oct. 26, 1999

[54] BALL GRID DEVICE WITH OPTICALLY TRANSMISSIVE COATING

[75] Inventors: James H. Knapp, Chandler; Dwight L. Daniels, Mesa; Keith E. Nelson, Tempe; Brian A. Webb, Chandler, all of Ariz.

[73] Assignee: Motorola, Inc., Schaumburg, Ill.

[21] Appl. No.: 08/917,121

[22] Filed: Aug. 25, 1997

[51] Int. Cl.$^6$ .............................. H01L 23/29; H01L 23/48
[52] U.S. Cl. ........................ 257/99; 257/98; 257/100; 257/433; 257/780; 257/790
[58] Field of Search ................. 257/81, 98–100, 257/433–434, 780, 790; 438/25–27

[56] References Cited

U.S. PATENT DOCUMENTS

| | | | |
|---|---|---|---|
| 4,843,036 | 6/1989 | Schmidt, et al. | 257/100 X |
| 5,239,198 | 8/1993 | Lin et al. | 257/693 |
| 5,814,837 | 9/1998 | Okazaki | 257/91 |

FOREIGN PATENT DOCUMENTS

| | | | |
|---|---|---|---|
| 63-86481 | 4/1988 | Japan | 257/432 |
| 3-119769 | 5/1991 | Japan | 257/100 |

*Primary Examiner*—John Guay
*Attorney, Agent, or Firm*—Rennie W. Dover

[57] ABSTRACT

A semiconductor device (10) coupled to ball grid array substrate (11) and encapsulated by an optically transmissive material (29, 31). The ball grid array substrate (11) has conductive interconnects (14) and a semiconductor receiving area (17) on a top surface and solder pads (13) on a bottom surface. An optoelectronic component (24) is mounted on the semiconductor receiving area (17) and encapsulated with the optically transmissive material (29, 31). Solder balls (18) are formed on the solder pads (13).

10 Claims, 1 Drawing Sheet

BALL GRID DEVICE WITH OPTICALLY TRANSMISSIVE COATING

BACKGROUND OF THE INVENTION

This invention relates, in general, to semiconductor devices and, more particularly, to ball-grid array semiconductor devices.

Ball Grid Array (BGA) and Over-Molded Pad Array Carrier (OMPAC) semiconductor devices have been developed to improve both the electrical and thermal performance characteristics of surface mount semiconductor devices. Typically, BGA and OMPAC semiconductor devices include a thin Printed Circuit Board (PCB) substrate on which a semiconductor chip is mounted. Portions of the chip are electrically coupled to conductive traces formed on a top surface of the PCB. Each conductive trace is routed to a corresponding conductive trace on the bottom surface of the PCB by a conductive via which extends through the PCB. The traces on the bottom surface of the PCB each terminate at a conductive pad to form an array of pads on the bottom of the PCB. The semiconductor chip and a portion of the PCB are encapsulated by an opaque mold compound using conventional molding techniques.

Although BGA and OMPAC semiconductor devices offer the advantages of increased interconnect packaging densities, elimination of coplanarity and skew limitations, low lead inductance, and a low profile, these devices have been unsuitable for use in optical applications because of the opaque mold compound.

Accordingly, it would be advantageous to have BGA and OMPAC devices capable of sending and receiving optical signals. It would be of further advantage for the BGA and OMPAC devices to be cost effective without reducing their electrical and thermal characteristics.

DETAILED DESCRIPTION OF THE DRAWINGS

Generally, the present invention provides a method and a means for forming Ball Grid Array (BGA) and Over-Molded Pad Array Carrier (OMPAC) semiconductor devices suitable for use in optical applications. Although the terms "optical" and "light" are used herein, it should be understood that these terms include all wavelengths between and including infrared and ultraviolet.

Figure 1:
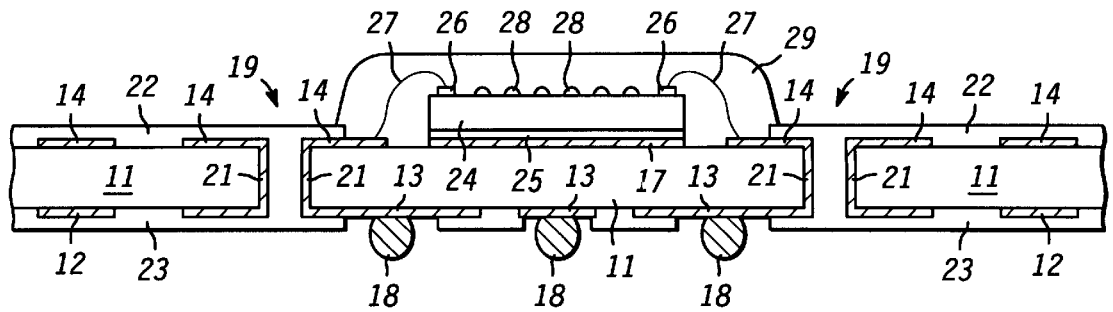
FIG. 1 illustrates a cross-sectional view of a portion of a semiconductor device in accordance with an embodiment of the present invention.

FIG. 1 illustrates a cross-sectional view of a portion of a semiconductor or optoelectronic device 10 in accordance with an embodiment of the present invention. Semiconductor device 10 is comprised of a substrate 11 having conductive traces 12 and solder pads 13 disposed on a bottom surface of substrate 11 and conductive traces 14 and a chip or die attach pad 17 disposed on a top surface. Solder pads 13 are also referred to as interconnect pads. Substrate 11 is also referred to as a ball grid array substrate. Chip attach pad 17 serves as a semiconductor chip receiving area. Suitable materials for substrate 11 include resins, such as epoxy, polyimide, aramide, triazine, or a phenolic resin, as well as epoxy-glass composites, Printed Circuit Board (PCB) materials, FR-4, FR-5, ceramics, and the like. Preferably, substrate 11 is Bismaleimide Triazine (BT) resin. By way of example, conductive traces 12 and 14, solder pads 13, and chip attach pads 17 are formed by laminating a conductive foil to the top and bottom surfaces of substrate 11. Conductive traces 12 and 14, solder pads 13, and chip attach pads 17 are defined by patterning the conductive foil using lithographic techniques.

Alternatively, conductive traces 12 and 14, solder pads 13, and chip attach pads 17 may be screen printed or otherwise deposited onto the surfaces of the substrate. Subsequently, conductive traces 12 and 14, solder pads 13, and chip attach pad 17 are typically plated with gold or a combination of gold and nickel to form a non25 oxidizable surface for wirebonding and attaching solder balls 18. Although conductive traces 12 and 14, solder pads 13, and chip attach pad 17 have been described as comprising two conductive layers, it should be understood that the number of conductive layers and the materials of the conductive layers is not a limitation of the present. It should be further understood that for purposes of clarity conductive traces 12 and 14, solder pads 13, and chip attach pads 17 are illustrated as being a single layer of material throughout the description of the invention. Further, the number of conductive traces 12 and 14 and solder pads 13 is not a limitation of the present invention.

Conductive vias 19 are typically formed in substrate 11 by drilling or punching vias or holes through solder pads 13, substrate 11, and conductive traces 14. Subsequently the vias are plated with an electrically conductive material 21 such as, for example, copper. Other suitable materials for plating the holes include gold, nickel, a combination of gold and nickel, and the like.

The exposed portions of the top surface of substrate 11, conductive traces 14, and chip attach pad 17 are covered with a layer 22 of solder mask material. Solder mask layer 22 covers the ends of conductive vias 19 at the top surface of substrate 11.

Then the bottom surface of substrate 11 is coated with an insulating material such as, for example, liquid solder mask material 23 using, for example, a screen printing technique. Preferably, solder mask material 23 fills conductive vias 19. Suitable materials for liquid solder mask material 23 include photoresist, polyimide, or the like. Although solder mask material 23 is shown as filling conductive vias 19, it should be understood this is not a limitation of the present invention. In other words, solder mask material 23 may partially fill conductive vias 19. Solder mask material 23 is cured after filling conductive vias 19.

Semiconductor device 10 further comprises a semiconductor component such as a semiconductor chip 24 coupled to die attach pad 17 via a die attach material 25 such as, for example, a silver filled epoxy. Semiconductor chip 24 is also referred to as an integrated circuit or semiconductor die. Other suitable die attach materials include rubbers, silicones, polyurethanes, and thermoplastics. Semiconductor chip 24 is preferably an optoelectronic component or photonic device containing optically active portions such as vertical cavity surface emitting lasers (VCSEL), light emitting diodes, laser diodes, edge-emitting diodes, charge coupled devices (CCDs), complementary metal oxide semiconductor (CMOS) image sensors, and other light detection devices. Thus, semiconductor chip 24 may be an optical detection device or an optical reception device.

In accordance with one aspect of the present invention, semiconductor chip 24 is comprised of a plurality of light or optical emission devices having a passivation layer (not shown) formed on the semiconductor chip and a lenslet 28 formed on each light emission device. Lenslets 28 focus the light emitted by the light emission devices. As those skilled in the art are aware, lenslets 28 are formed over the light emission devices while semiconductor chip 24 is still in wafer form.

Semiconductor chip 24 has chip bond pads 26 that are coupled to corresponding conductive traces 14 via interconnect wires 27. Techniques for coupling semiconductor chips to chip attach pads and wirebonding chip bond pads with conductive traces are well known to those skilled in the art.

Semiconductor chip 24, interconnect wires 27, and a portion of solder mask layer 22 are covered by an optically transmissive material such as an optically transmissive potting material 29, which is then cured. Potting material 29 is applied using techniques such as dispensing, transfer molding, injection molding, and the like. The passivation layer (not shown) and lenslets 28 are sensitive to heat as well as being susceptible to oxidation. Therefore, potting material 29 protects the passivation layer and lenslets 28 formed on semiconductor chip 24 from damage by heat and oxidation, among other things.

By way of example, optically transmissive potting material 29 is formed by combining an acrylate resin, a difunctional diluent, a monofunctional diluent, a thermal and/or light curing activator, and a stabilizer. More particularly, the concentration of the acrylate resin is between approximately 70 and approximately 99 percent by weight, the concentration of the difunctional diluent is between approximately 0 and approximately 20 percent by weight, the concentration of the monofunctional diluent is between approximately 0 and approximately 10 percent by weight, the concentration of the activator is between approximately 0.1 and approximately 5 percent by weight, and the concentration of the stabilizer is between approximately 0 and approximately 0.4 percent by weight. By way of example, the acrylate resin is an epoxy diacrylate ester, the difunctional diluent is tripropyleneglycol diacrylate, the monofunctional diluent is styrene, and the activator is benzoyl peroxide and/or 1-hydroxycyclohexyl phenyl ketone.

More particularly, the concentration of the epoxy diacrylate ester is approximately 89 percent by weight, the concentration of the tripropyleneglycol diacrylate is approximately 17 percent by weight, the concentration of the styrene is approximately 10 percent by weight, and the concentration of the benzoyl peroxide is approximately 1 percent by weight. Alternatively, the concentration of the epoxy diacrylate ester is approximately 80 percent by weight, the concentration of the tripropyleneglycol diacrylate is approximately 17 percent by weight, the concentration of the styrene is approximately 2 percent by weight, and the concentration of the benzoyl peroxide is approximately 1 percent by weight. Techniques for combining the components of the mold compound and coating the optoelectronic devices with the potting material are known to those skilled in the art.

Solder mask layer 23 is patterned using techniques known to those skilled in the art to expose portions of solder pads 13. Conductive balls such as solder balls 18 are coupled to solder pads 13 by positioning each solder ball 18 on a corresponding solder pad 13 in the presence of a flux and performing a solder reflow operation to form a metallurgical bond. Techniques for coupling solder balls to solder pads are well known in the art. Conductive solder balls 18 are later connected to a next level of assembly or printed circuit board (not shown) using a standard solder reflow process. Conductive solder balls 18 are connected to contact pads on the printed circuit board to form solder joints. After the mounting process, the solder joints take a flattened spherical shape defined by solder volume and wetting areas. The number and arrangement of conductive solder balls 18 on the lower surface of substrate 11 depends on circuit requirements including input/output (I/O), power, and ground connections. Although conductive solder balls 18 are shown as being coupled to solder pads 13, it should be understood the type of conductor coupled to solder pads 13 is not a limitation of the present invention. Other suitable conductors include pins, metal strips, pads, solder columns, or the like.

Figure 2:
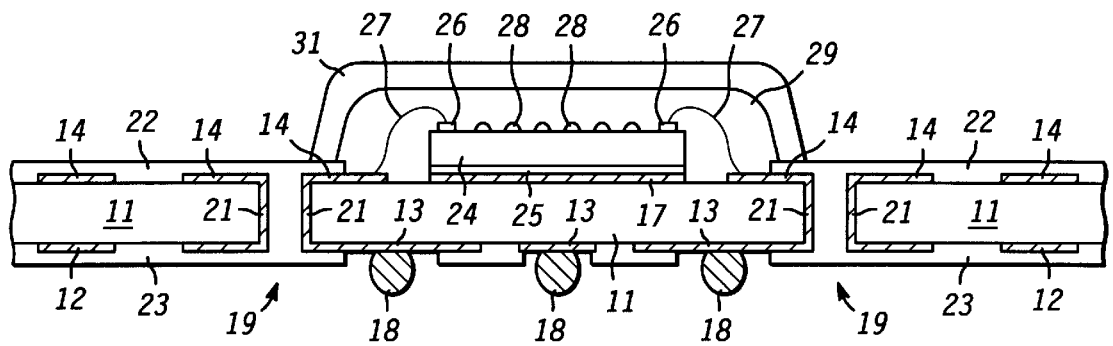
FIG. 2 illustrates a cross-sectional view of a portion of a semiconductor device in accordance with another embodiment of the present invention.

FIG. 2 illustrates a cross-sectional view of a portion of a semiconductor device 40 in accordance with another embodiment of the present invention. It should be understood that the same reference numerals are used in the figures to denote the same elements. More particularly, optically transmissive potting material 29 is covered by an optically transmissive mold compound 31. Suitable materials for optically transmissive mold compound 31 include MG-18 produced by Dexter Hysol, NT100 produced by Nitto Kasei K.K., and the like. It should be noted that the optically transmissive potting material 29 and optically transmissive mold compound 31 may be referred to either individually or collectively as an optically transmissive material. By way of example, the mold compound is transfer molded using techniques known to those skilled in the art. This technique is suitable for photonic devices used in color and monochromatic, i.e., black and white, applications. It should be understood that the technique for disposing the mold compound over both substrate 11 and optically transmissive potting material 29 is not limited to transfer molding. For example, the mold compound can be injection molded.

Figure 3:
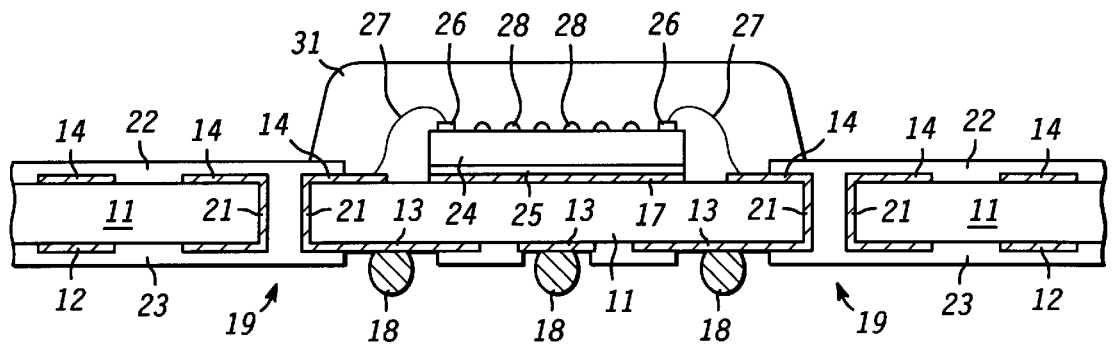
FIG. 3 illustrates a cross-sectional view of a portion of a semiconductor device in accordance with yet another embodiment of the present invention.

FIG. 3 illustrates a cross-sectional view of a portion of a semiconductor device 45 in accordance with yet another embodiment of the present invention. It should be understood that the same reference numerals are used in the figures to denote the same elements. In accordance with this embodiment, an optically transmissive potting material is not dispensed onto semiconductor chip 24. Thus, semiconductor chip 24, interconnect wires 27, and a portion of solder mask layer 22 are covered by an optically transmissive mold compound 31. This technique is particularly suitable for materials that are susceptible to degradation by temperature and oxidation.

Figure 4:
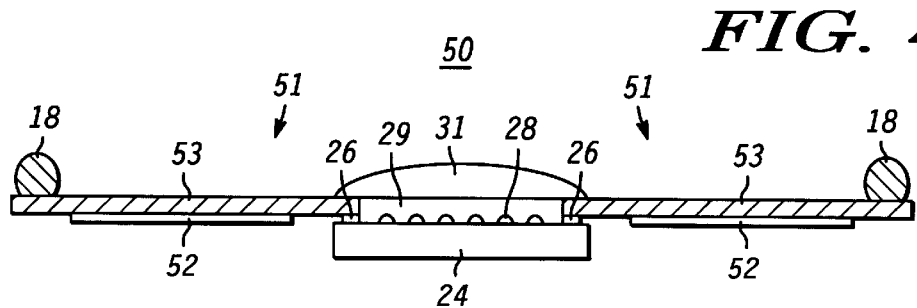
FIG. 4 illustrates a cross-sectional view of a portion of a semiconductor device in accordance with a tape automated bonding (TAB) embodiment of the present invention.

FIG. 4 illustrates a cross-sectional view of a portion of a semiconductor device 50 in accordance with a tape automated bond (TAB) embodiment of the present invention. Again, it should be understood that the same reference numerals are used in the figures to denote the same elements. Semiconductor device 50 includes semiconductor chip 24 mounted to a TAB tape 51. As those skilled in the art are aware, a TAB tape such as TAB tape 51 includes a mylar film 52 having conductive traces 53 disposed thereon. Chip bond pads 26 of TAB tape 51 are bonded to corresponding conductive traces 53. Semiconductor chip 24 is coated with optically transmissive potting material 29 which is coated with mold compound 31.

Although the TAB embodiment of FIG. 4 includes both potting material 29 and mold compound 31, it should be understood this is not a limitation of the present invention. For example, either potting material 29 or mold compound 31 may be absent from the semiconductor device. Further, lenslets 28 are optional features of the embodiments shown in FIGS. 1–4. In other words, lenslets 28 may be absent from semiconductor chip 24.

By now it should be appreciated that a method and a means have been provided for forming an optoelectronic semiconductor device. An advantage of this structure is that its size is reduced compared to traditional optoelectronic semiconductor devices. A further advantage is that the small size provides an improved electrical performance.

We claim:

1. An optoelectronic device, comprising:
   a ball grid array substrate having a surface and a semiconductor component receiving area;
   a semiconductor component coupled to the semiconductor component receiving area;
   a semiconductor component located in the semiconductor component receiving area; and
   an optically transmissive material covering at least a portion of the semiconductor component, wherein the optically transmissive material comprises:
      an acrylate resin, wherein a concentration of the acrylate resin is between approximately 70 and 99 percent by weight;
      a difunctional diluent, wherein a concentration of the difunctional diluent is between approximately 0 and 20 percent by weight;
      a monofunctional diluent, wherein a concentration of the monofunctional diluent is between approximately 0 and 10 percent by weight;
      an activator, wherein a concentration of the activator is between approximately 0.1 and 5 percent by weight; and
      a stabilizer, wherein a concentration of the stabilizer is between approximately 0 and 0.4 percent by weight.

2. The optoelectronic device of claim 1, wherein the semiconductor component is an optoelectronic component.

3. The optoelectronic device of claim 2, wherein the optoelectronic component is selected from the group consisting of light emitting diodes, vertical cavity surface emitting diodes, laser diodes, edge-emitting diodes, charge coupled devices, and complementary metal oxide semiconductor image sensors.

4. The optoelectronic device of claim 1, wherein the ball grid array substrate comprises a printed circuit board.

5. The optoelectronic device of claim 1, further including a plurality of wirebonds coupling the semiconductor component to the ball grid array substrate.

6. The optoelectronic device of claim 1, further including a tape automated bond (TAB) substrate, wherein the ball grid array substrate is coupled to the TAB substrate.

7. The optoelectronic device of claim 1, wherein the acrylate resin is an epoxy diacrylate ester.

8. The optoelectronic device of claim 7, wherein the difunctional diluent is tripropyleneglycol diacrylate, the monofunctional diluent is styrene, and the activator is benzoyl peroxide.

9. The optoelectronic device of claim 8, wherein the concentration of the epoxy diacrylate ester is approximately 80 percent by weight, the concentration of the tripropyleneglycol diacrylate is approximately 17 percent by weight, the concentration of the styrene is approximately 2 percent by weight, and the concentration of the benzoyl peroxide is approximately 1 percent by weight.

10. The optoelectronic device of claim 8, wherein the concentration of the epoxy diacrylate ester is approximately 80 percent by weight, the concentration of the tripropyleneglycol diacrylate is approximately 17 percent by weight, the concentration of the styrene is approximately 2 percent by weight, and the concentration of the benzoyl peroxide is approximately 1 percent by weight.

* * * * *